US011497142B2

(12) United States Patent
Hellström

(10) Patent No.: US 11,497,142 B2
(45) Date of Patent: Nov. 8, 2022

(54) SURFACE MOUNTED HEAT BUFFER

(71) Applicant: AROS ELECTRONICS AB, Mölndal (SE)

(72) Inventor: Jerker Hellström, Nol (SE)

(73) Assignee: AROS ELECTRONICS AB, Mölndal (SE)

( * ) Notice: Subject to any disclaimer, the term of this patent is extended or adjusted under 35 U.S.C. 154(b) by 78 days.

(21) Appl. No.: 17/276,915

(22) PCT Filed: Oct. 3, 2019

(86) PCT No.: PCT/EP2019/076834
§ 371 (c)(1),
(2) Date: Mar. 17, 2021

(87) PCT Pub. No.: WO2020/070254
PCT Pub. Date: Apr. 9, 2020

(65) Prior Publication Data
US 2021/0378133 A1 Dec. 2, 2021

(30) Foreign Application Priority Data
Oct. 5, 2018 (EP) .................................. 18198854

(51) Int. Cl.
H05K 7/20 (2006.01)
H05K 1/02 (2006.01)
(Continued)

(52) U.S. Cl.
CPC ......... H05K 7/2039 (2013.01); H05K 1/0203 (2013.01); H05K 1/111 (2013.01);
(Continued)

(58) Field of Classification Search
CPC ............... H05K 7/2039; H05K 1/0203; H05K 2201/066
(Continued)

(56) References Cited

U.S. PATENT DOCUMENTS 5,646,373 A 7/1997 Collins et al.
5,915,754 A 6/1999 Hiller et al.
(Continued)

FOREIGN PATENT DOCUMENTS

DE 19654353 A1 6/1998
DE 202004011399 U1 12/2004
EP 0751562 A2 1/1997

OTHER PUBLICATIONS

International Search Report and Written Opinion for PCT/EP2019/076834 which is the parent application to the instant application, dated Jan. 2, 2020; 12 pages.
(Continued)

Primary Examiner — Sherman Ng
(74) Attorney, Agent, or Firm — Harness, Dickey & Pierce, P.L.C.; Anthony Fussner

(57) ABSTRACT

An assembly (110) for dissipating heat generated by a heat generating electrical component (16) which is surface mounted on a circuit board (11) in a surface mounting process. The assembly comprises a heat buffer (120) made of a thermally and electrically conducing material, and being surface mounted on the circuit board (11) so as to be soldered to a thermal flag (18) of the heat generating electrical component (16). The assembly further comprises a heat sink (12) in thermal contact with the heat buffer, and a galvanic separation (13) between the heat buffer and heat sink. The heat capacitance of the heat buffer can absorb short term increases in heat dissipation from the electrical component, before the heat is further dissipated to the galvanically separated heat sink. This may drastically improve performance of the surface mounted component.

18 Claims, 4 Drawing Sheets

(51) Int. Cl.
*H05K 1/11* (2006.01)
*H05K 1/18* (2006.01)
*H05K 3/34* (2006.01)
*H05K 3/40* (2006.01)

(52) U.S. Cl.
CPC .............. *H05K 1/181* (2013.01); *H05K 3/34* (2013.01); *H05K 3/4007* (2013.01); *H05K 2201/066* (2013.01)

(58) Field of Classification Search
USPC ........................................... 361/720
See application file for complete search history.

(56) References Cited

U.S. PATENT DOCUMENTS

| | | | | |
|---|---|---|---|---|
| 6,190,941 | B1* | 2/2001 | Heinz | H05K 3/0094 438/106 |
| 6,919,535 | B2* | 7/2005 | Uhl | H01L 23/3677 219/202 |
| 2001/0026441 | A1 | 10/2001 | Nakamura | |
| 2008/0017406 | A1* | 1/2008 | Espino | H01L 23/3672 257/E23.105 |
| 2012/0024575 | A1* | 2/2012 | Zhang | H01L 23/3677 29/832 |
| 2013/0021769 | A1* | 1/2013 | Fukuzono | H01L 25/18 361/783 |
| 2014/0376190 | A1 | 12/2014 | Dean et al. | |
| 2016/0088720 | A1* | 3/2016 | Willis | H01L 23/552 361/709 |

OTHER PUBLICATIONS

Extended European Search Report for EP18198854.4 which is the priority patent application to the instant application; dated Apr. 1, 2019 10 pages.

James J Licari,, Dale W. Swanson: "Applications", Adhesives Technology for Electronic Applications, Jan. 1, 2005, pp. 261-348, William Andrew Publishing, Norwich, NY USA; https://linkinghub.elsevier.com/retrieve/pii/B9780815515135500073 (retrieved on Mar. 20, 2019).

* cited by examiner

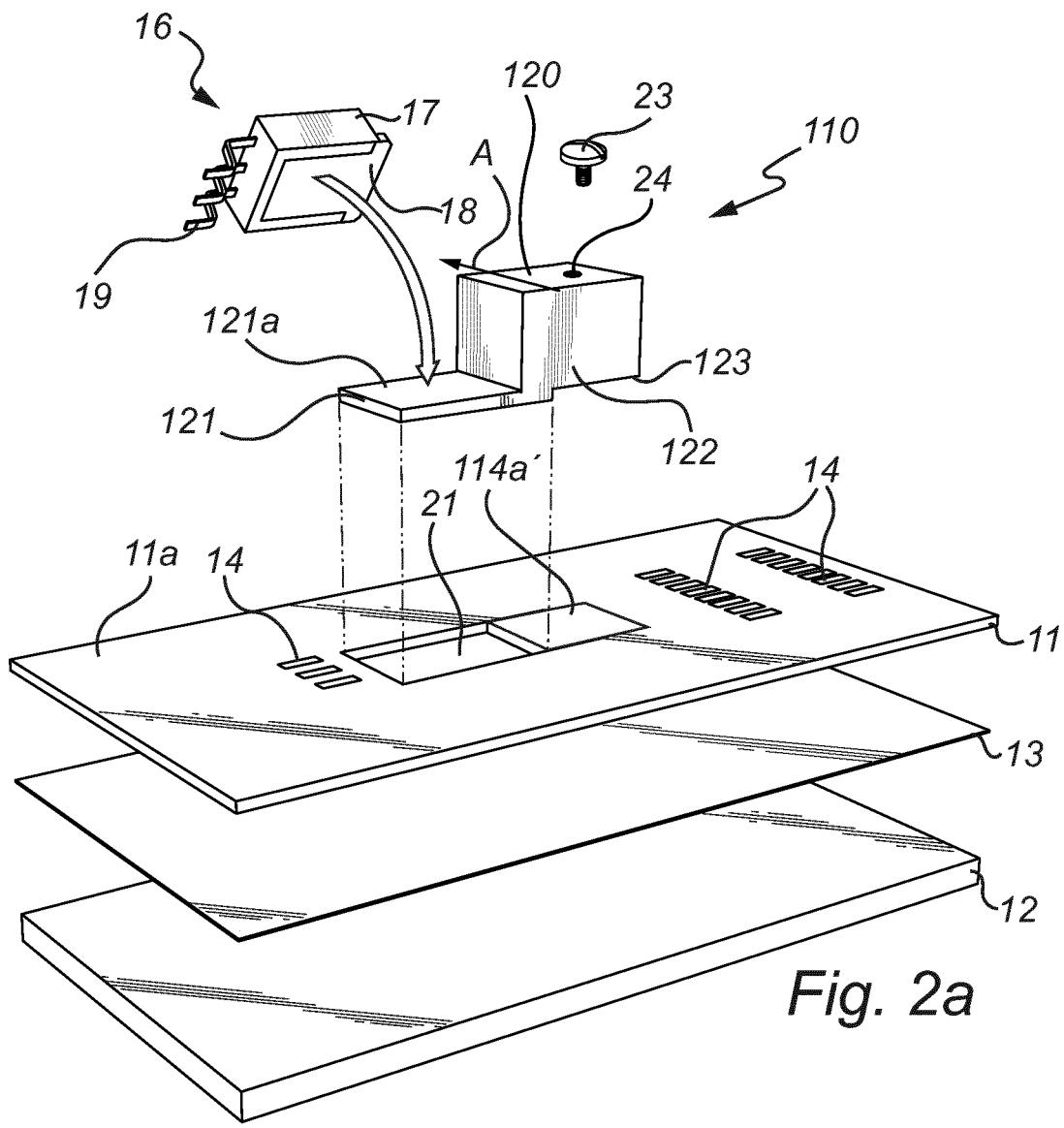
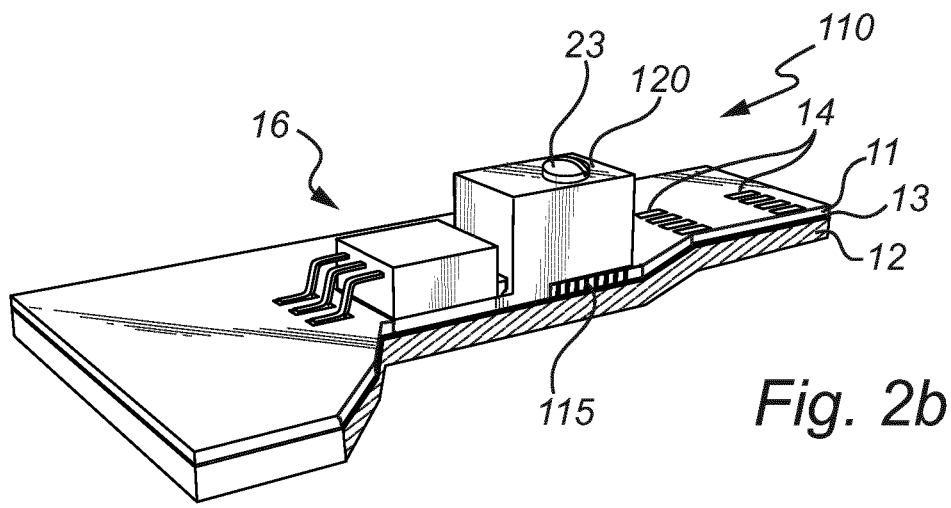
Fig. 2a
Fig. 2b

SURFACE MOUNTED HEAT BUFFER

This patent application is a U.S. national stage filing under 35 U.S.C. § 371 of PCT International Application No. PCT/EP2019/076834 filed Oct. 3, 2019 (published as WO2020/070254 on Apr. 9, 2020), which claims priority to and the benefit of European Application No. 18198854.4 filed Oct. 5, 2018. The entire contents of these applications are incorporated herein by reference in their entirety.

FIELD OF THE INVENTION

The present invention relates to an assembly for heat dissipation from surface mounted electrical components, also known as surface mounted devices (SMDs).

BACKGROUND OF THE INVENTION

Many electrical components, especially semiconductor components such as solid state transistors, solid state power switches and integrated circuits, generate heat during operation. Some of the most important examples include MOS-FETs (Metal Oxide Semiconductor Field Effect Transistors) and IGBTs (Isolated Gate Bipolar Transistors). In many cases, the performance of these components is reduced by their ability to dissipate the generated heat. Also, such heat needs to be dissipated in order to avoid thermal degradation, or complete malfunction. Some components are able to satisfactorily dissipate generated heat, while others need additional cooling elements like heat sinks to dissipate heat.

In recent years, surface-mount technology (SMT), where components are mounted on the suirface of the printed scircuit board (PCB) rather than in holes, is often used for producing electronic circuits. When using SMT, solder pads are printed (e.g. screen printed) on the circuit board, the components are placed on the circuit board in contact with the pads, and the circuit board and components is heated in an oven to melt the solder. Components adapted for this type of mounting are often referred to as surface mounted devices, SMD:s. For automatic and semi-automatic production processes, surface mounting is often the preferred mounting method. However, surface mounting creates challenges with respect to cooling of the components.

The most common approach to cooling surface mounted components is to dissipate heat through the circuit board to a heat sink arranged on the other side. The component typically has a thermal "pad" or "flag" which is soldered to a thermal pad on the circuit board. The pads of various components are is in turn thermally connected to a heat sink, typically by means of vias, i.e. through holes in the circuit board filled with metal. In cases where the thermal flag also serves as a terminal of the component, e.g. a drain/collector of a power transistor, a galvanic separation is required between the thermal flag of the component and the vias, and this is typically provided by an electrically isolating—but thermally conducting—layer (e.g. aluminum oxide) or by forming "blind" vias, i.e. vias which do not fully penetrate the circuit board.

Another approach is to separately mount a heat sink on top of the electrical component, and place it in thermal contact with the component. For example some microprocessors are provided with such "top mounted" heat sinks, typically strapped onto the processor and thermally connected to the outside of the package with suitable thermal paste.

Yet another example, shown e.g. in U.S. Pat. No. 5,930,114, is to surface mount a heat sink attachment to the circuit board in thermal connection with the pad on which the surface mounted component is soldered to. Heat may then be dissipated across the pad surface to the heat sink attachment and further to a heat sink attached thereto.

A challenge with conventional approaches is that the thermal resistance between the component and the heat sink is too large. Thermal resistance is defined as heat increase per power consumption, measured in K/W (Kelvin per Watt). Thermal resistance thus defines how the temperature of the component will increase for a given power consumption. Note, that even if the heat sink has sufficient thermal capacity to dissipate heat from the average power consumed by the component, the thermal resistance will prevent sufficiently fast dissipation of generated heat associated with power peaks. For many components, such as solid state power switches in power converters, the peak power may be several times greater than the average power consumption.

As a practical example, the thermal resistance between a silicon junction and the component casing (e.g. a TO-263 package) is typically in the range 0.5-2 K/W, the thermal resistance between through the circuit board is typically in the range 1-5 K/W, and the thermal resistance through a layer of aluminum oxide is typically in the range 0.5-3 K/W. So, conservatively speaking around 5 K/W in total. If the heat sink has a temperature of 80° C. and the junction can withstand a temperature of 175° C., then the available temperature rise is 95° C. With a thermal resistance of 5 K/W, the maximum allowed power consumption (loss) in the component is 19 W. The power loss has a direct impact on the available overall power of the system, so there is a significant advantage with reducing thermal resistance.

Document DE 19654353 discloses a mounting arrangement for a semiconductor component on a printed circuit board. A heat sink is arranged between the component and the circuit board. The heat sink is electrically isolated from the circuit board by means of an isolating layer.

Thus, there is a need for an improved solution allowing satisfactory heat dissipation from surface mounted components.

General Disclosure of the Invention

It is an object of the present invention to overcome this challenge, and to provide improved dissipation of heat from a heat generating electrical component which is surface mounted on a circuit board.

According to a first aspect of the invention, this and other objects are achieved by an assembly for dissipating heat generated by a heat generating electrical component which is surface mounted on a circuit board, comprising a heat buffer made of a thermally and electrically conducing material, said buffer being surface mounted on the circuit board so as to be soldered to a thermal flag of the heat generating electrical component, a heat sink in thermal contact with the heat buffer, and a galvanic separation between the heat buffer and the heat sink.

Compared to conventional solutions, the thermal flag of the heat generating component is thus soldered to a heat buffer during the surface mounting process, so that the heat capacitance of this heat buffer can absorb short term increases in heat dissipation from the electrical component. The heat buffer thus serves as an intermediate storage of heat, before the heat is further dissipated to the galvanically separated heat sink. For many electrical components, such a heat buffer will enable handling of high power consumption peaks, drastically improving performance of the surface mounted component.

As an example, the heat buffer may have a thermal impedance less than 0.5 K/W in a time span of 1-3 s. Typical materials suitable for the heat buffer are copper, brass, and similar materials.

An appropriate mass of a heat buffer made of copper or brass may be in the order of ten grams. This may be compared to the amount of copper in a typical power transistor package (e.g. a TO-263) which is in the order of one gram. The heat capacitance is thus increased by a factor of ten, indicating that the component could withstand a given power consumption (loss) for ten times longer.

Further, in many applications, the invention also enables lower thermal resistance through the circuit board and galvanic separation to the heat sink. In conventional solutions, this thermal resistance is governed to a large extent by the soldered area of the thermal flag of the component. With the present invention, where the thermal flag is also soldered to the heat buffer which in turn is also surface mounted (soldered) to the circuit board, it is the combined soldered area of the thermal flag and the heat buffer which can be used to provide a thermal interface through the circuit board, thereby lowering the thermal resistance.

Once again taking the TO-263 package as an example, its thermal flag has a surface area of 75 square millimeters. If a surface mounted buffer, soldered to the flag, has a surface mounted area of 150 square millimeters, the thermal resistance to the heat sink may be reduced to a third (total surface area three times as large).

According to one embodiment, the heat buffer is surface mounted adjacent to the electrical component, and is soldered to an end portion of the thermal flag which is accessible from above.

Further, the component and the heat buffer may both be surface mounted to a solder pad which is thermally connected to the heat sink by a plurality of vias extending through the circuit board. It is noted that the solder pad in this case is not necessarily one single continuous pad, but may be formed by two or more discrete pads.

For many components (e.g. power transistors) the surface of the actual semiconductor junction (where heat is generated) is significantly smaller than the surface of the thermal flag. The heat dissipating process therefore involves spreading the generated heat sideways across the thermal flag. As the thermal flag is not particularly thick (typically about 1 mm) this sideways heat spreading contributes to the thermal resistance.

According to another embodiment, addressing this particular problem, the heat buffer is therefore mounted in a corresponding opening formed in the circuit board, and during the surface mounting process the thermal flag is soldered on top of an essentially flat receiving portion of the heat buffer. In order to enable surface mounting, an upper surface of the receiving portion is preferably level with the rest of the circuit board.

It is noted that the heat buffer in this embodiment is not, strictly speaking, a surface mounted device, SMD, as it is in fact mounted in an opening in the circuit board. However, it is still mounted using surface mount technology, and therefore, for the purpose of the present invention, the heat buffer will also in this embodiment be referred to as being surface mounted.

The receiving portion preferably has a thickness similar to the thickness of the circuit board, e.g. 1.4-1.5 mm, and heat from the semiconductor junction can thus be spread more efficiently, and the thermal resistance between the component and the heat sink can be reduced even further. Preferably, the receiving portion has a thickness in the range of 90%-110% of a thickness of the circuit board In some embodiments, the thickness of the receiving portion is slightly greater than the circuit board, in which case a gap between the underside of the circuit board and the heat sink may be bridged by a resilient layer.

In other embodiments, the thickness of the receiving portion is slightly less than the circuit board, in which case a gap between the underside of the heat buffer and the heat sink may be bridged by a thermally conducting layer, such as a gap pad or gap filler.

When the heat buffer is mounted in an opening in the circuit board, a protruding portion of the heat buffer (protruding outside the opening, so as to rest on the surface of the circuit board) is preferably surface mounted to a solder pad on the circuit board, which thermal pad is preferably thermally connected to the heat sink, e.g. by a plurality of vias extending through the circuit board.

In case the thermal flag serves as a terminal of the electrical component (e.g. drain/collector of a power transistor), the buffer may be provided with a contact point to facilitate electrical connection of the terminal. For example, the buffer may be provided with a threaded hole.

BRIEF DESCRIPTION OF THE DRAWINGS

The present invention will be described in more detail with reference to the appended drawings, showing currently preferred embodiments of the invention.

FIGS. 2a-2b show a perspective view of an assembly according to a second embodiment of the present invention.

DETAILED DESCRIPTION OF PREFERRED EMBODIMENTS

Figure 1A:
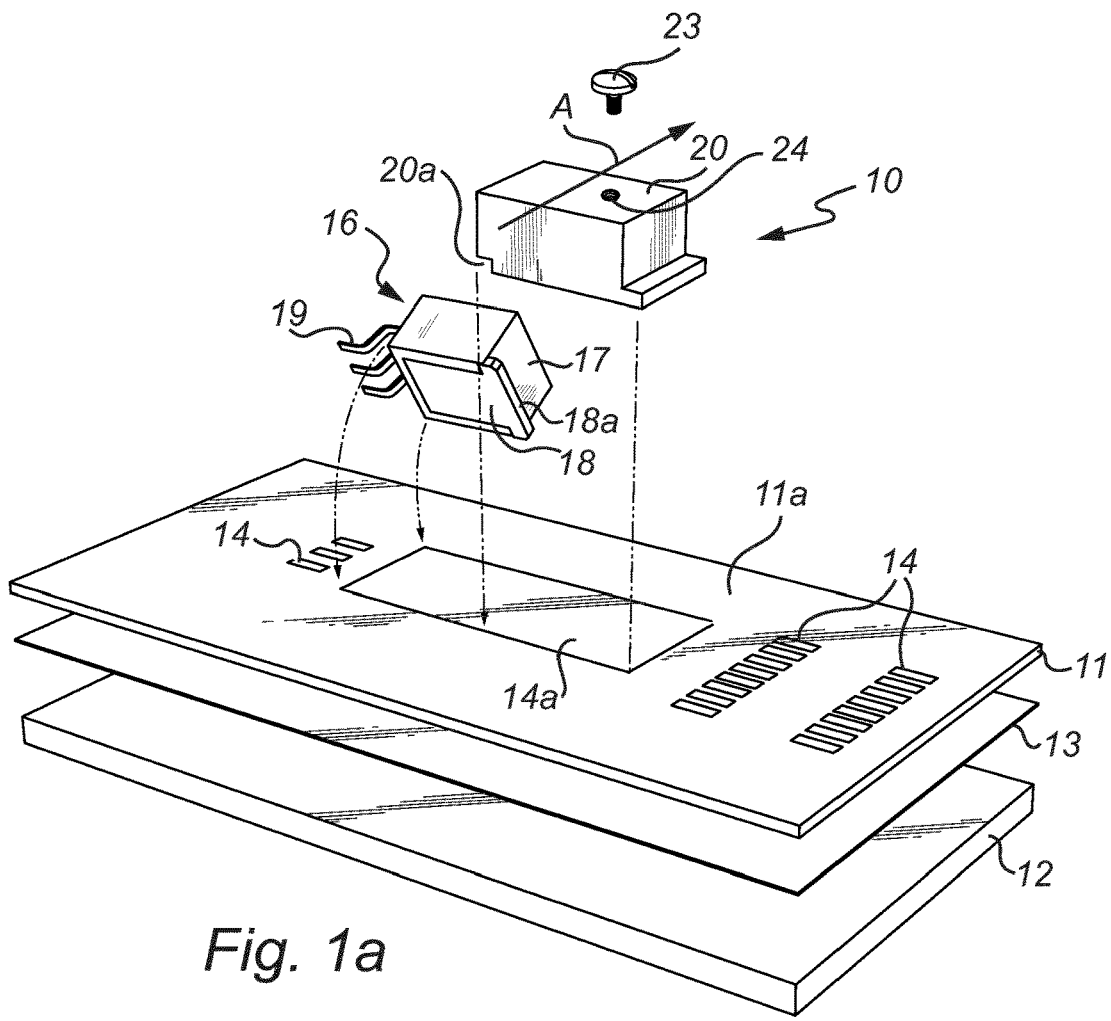
FIGS. 1a-1b show a perspective view of an assembly according to a first embodiment of the present invention.

A first embodiment of the present invention is illustrated in FIGS. 1a (exploded view) and 1b (mounted view). The assembly 10 here includes a printed circuit board (PCB) 11, a heat sink 12, and a galvanically isolating layer 13. The heat sink is made of a heat conducting material, such as aluminum, and may be formed with flanges (not shown) to increase convection with surrounding air. The galvanically isolating layer is intended to galvanically separate the heat sink from the circuit board, while at the same time providing satisfactory thermal connection. The layer may be aluminum oxide. A set of solder pads 14 have been printed onto the upper surface 11a of the PCB using e.g. screen printing methods. The solder material is typically an SAC (Sn/Ag/Cu) alloy.

Figure 1B:
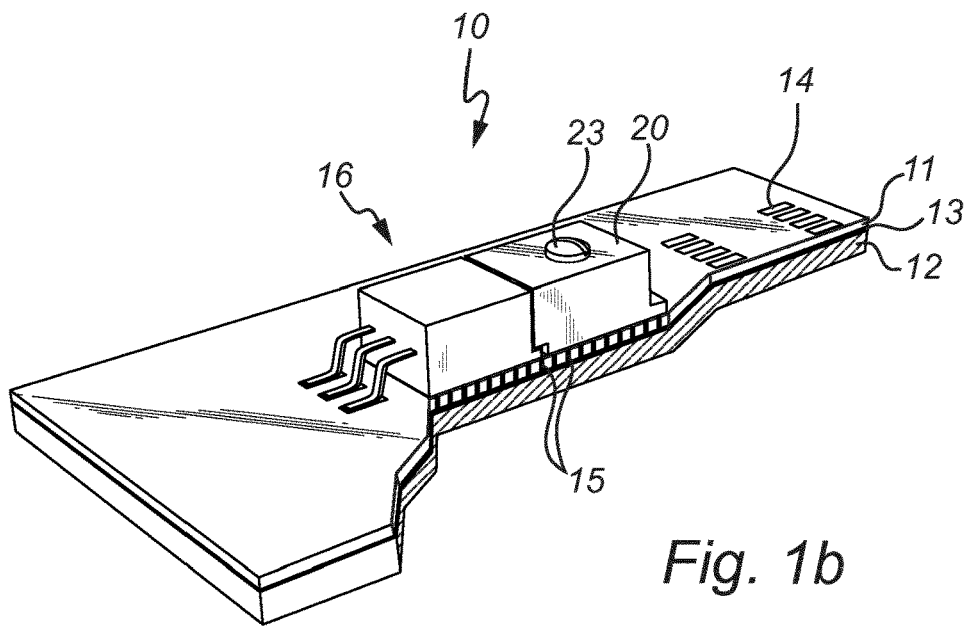

At least one of the pads is referred to as a thermal pad 14a, and is placed in thermal connection with the heat sink 12 via a set of vias 15 (see FIG. 1b). Each via 15 can be a metal filled hole extending through the circuit board 11. The vias 15 provide a thermal connection though the circuit board, while the layer 13 provides galvanic isolation of the heat sink 12.

A heat generating electrical component 16 has been surface mounted (i.e. mounted using surface-mount technology, SMT) to the solder pads 14. The component 16 can thus be referred to as a surface mounting device, SMD. The surface mounting process typically involves placing SMDs on relevant solder pads using a pick-and-place machine (robot), and then heating the circuit board and SMDs arranged thereon in an oven.

As an example, the component 16 is a semiconductor device, e.g. a power transistor such as a MOSFET or IGBT, having one or several p-n junctions in a semiconductor crystal. The semiconductor may be made of silicon. To be surface mountable, semiconductor components such as power transistors, may be arranged inside an SMD package 17, encapsulating the component 16. Examples of known SMD packages relevant in this context include TO-262, TO-263 and TO-268.

The component 16, here the SMD package 17, has a thermal flag 18 and terminal legs 19 which are soldered to the pads 14a, 14 respectively, during the surface mounting process. The purpose of the thermal flag 18 is to ensure a satisfactory thermal connection of the component 16 with the heat sink 12, such that heat generated by the component 16, e.g. by p-n junctions in the component, can be dissipated.

The thermal flag 18 typically (but not necessarily) serves as one of the terminals of the component 16. For example, if the component is a power transistor, the thermal flag is typically the drain/collector of the transistor.

The assembly further includes a heat buffer 20 made of an electrically and thermally conducting material, such as copper or brass. The heat buffer 20 is also surface mounted to the circuit board, and also soldered to the flag 18 during the same surface mounting process.

The heat buffer may have a mass in the order of 10 gram, e.g. in the range 5-25 gram, and will thus significantly increase the thermal capacitance of the component 16. As an example, an SMD package such as the TO-263 only contains about 1 gram copper. A copper buffer with a mass of 10 gram will thus increase the heat capacitance by a factor 10.

Figure 5:
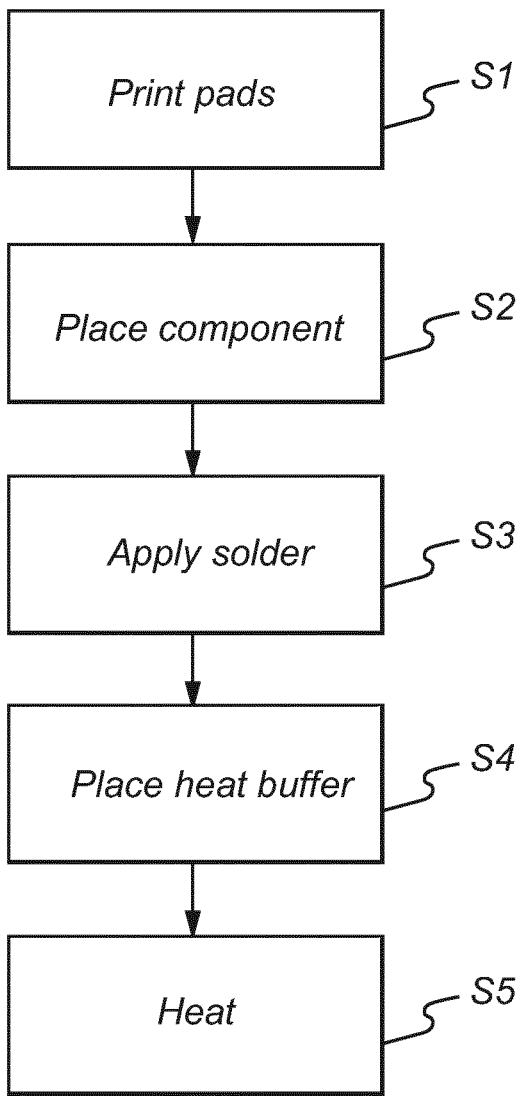
FIG. 5 is a flow chart illustrating the surface mounting process of the assembly in FIG. 1a-1b.

With reference to FIG. 5, the surface mounting process of the component 16 and heat buffer 20 will be briefly described, First, in step S1, the solder pads, including the pad 14a, are printed on the PCB 11. Then, in step S2, the component 16 (and other SMD:s) is placed on the pad 14a, e.g. using a pick-and-place machine, and in step S3 solder paste is applied to a portion 18a of the flag 18 extending outside the side of the component 16/package 17 so as to be accessible from above. The solder may be applied e.g. using a solder paste application nozzle, or by using the pick-and-place machine to place small flakes of solder material on the portion 18a. In step S4 the heat buffer 20 is then placed adjacent the component 16 (or the package 17), such that a recess 20a rests on the portion 18a. Finally, in step S5, the circuit board 11 and SMDs placed thereon is heated in an oven to complete the surface mounting.

Turning now to FIG. 2a-2b, a second embodiment of the present invention is illustrated. The assembly 110 again includes a circuit board 11, a heat sink 12, a galvanically isolating layer 13 and an electrical component 16, here enclosed by a package 17, having a thermal pad 18 and terminal legs 19. These elements will not be described again.

In this embodiment, the heat buffer 120 is formed with an essentially flat receiving portion 121, extending from a main body 122 of the heat buffer 120. Further, the circuit board 11 is formed with an opening 21 corresponding to the shape of the heat buffer 120, so that the heat buffer 120 can be mounted in this opening.

A solder pad 114a, smaller than the pad 14a in FIG. 2a, is printed next to the opening, and a protruding portion 123 of the heat buffer is soldered to this pad. Optionally, and as illustrated in FIG. 3b, this pad 114a may be thermally connected to the heat sink 12 by vias 115.

In the illustrated example, the thickness of the receiving portion corresponds to the thickness of the circuit board, which in a typical example is 1.4 mm. Further, the upper surface 121a of the receiving portion 121 is level with the upper surface of the circuit board, so that the thermal flag 18 of the component can be soldered to the upper surface 121a, while the legs of the component are soldered to corresponding solder pads 14 on the circuit board.

Figure 6:
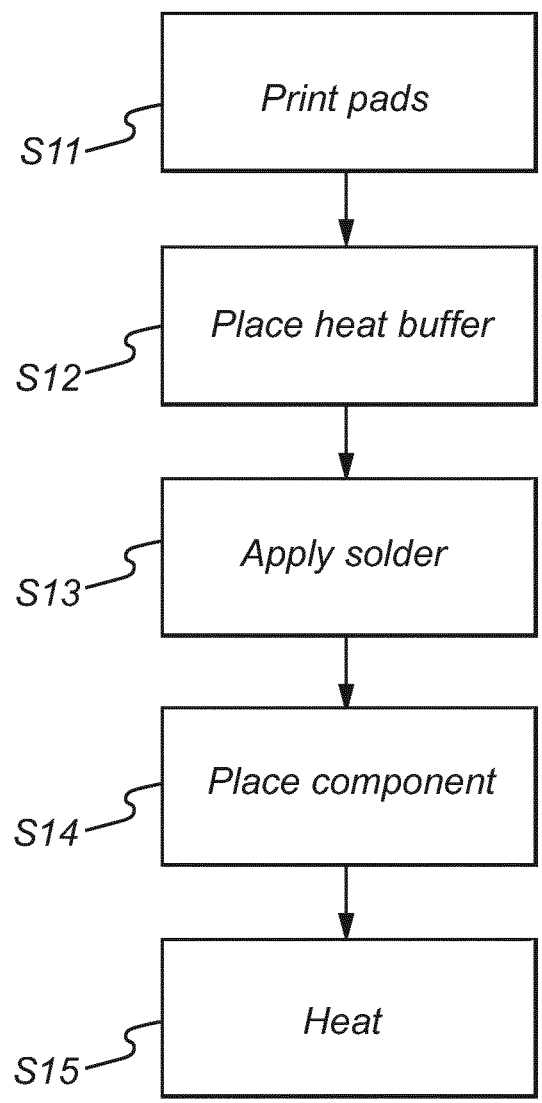
FIG. 6 is a flow chart illustrating the surface mounting process of the assembly in FIG. 2a-2b.

With reference to FIG. 6, the surface mounting process of the component 16 and heat buffer 120 will be briefly described. First, in step S11, the solder pads, including the pad 114a, are printed on the PCB 11. Then, in step S12, the heat buffer 120 is placed in the opening 21 (e.g. using a pcik-and-place machine), after which, in step S13, solder is applied on the surface 121a (e.g. using a solder dispensing nozzle or by placing flakes of solder). In step S14 the component 16 is placed on the surface 121a. Finally, in step S15, the circuit board 11 and SMDs placed thereon is then heated in an oven to complete the surface mounting. It is noted that the heat buffer 120, despite the fact that it is arranged in an opening 21, is still surface mounted to the pad 114a.

It is noted that the circuit board 11 is typically handled in such a way during a surface mounting process that it has no underlying support. Here, however, the heat buffer 120 needs to be supported in the opening 21 throughout the surface mounting process. Various examples of how this can be achieved are shown in FIGS. 3a-c.

Figure 3A:
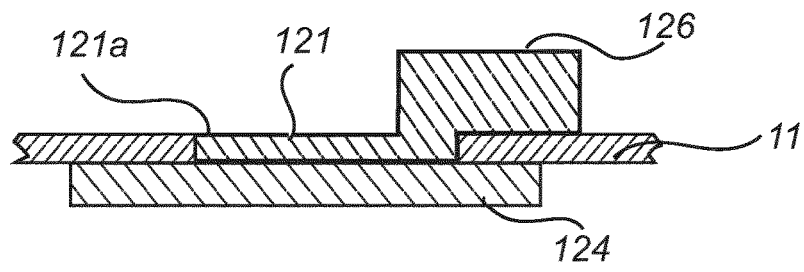
FIG. 3a-c show three examples of how the buffer in FIG. 2a-b can be supported during the surface mounting process.
Figure 3B:
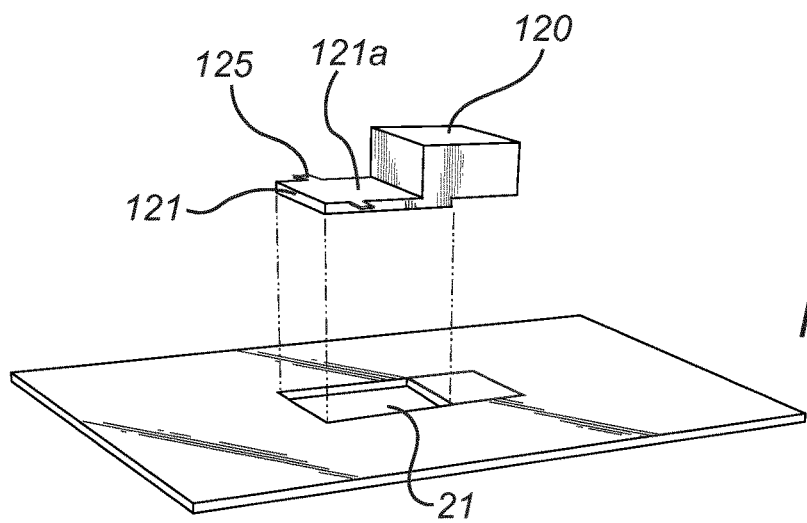

In FIG. 3a, the circuit board 11 and everything arranged on it are placed on a carrier 124 during the surface mounting process. The carrier 124 may be made e.g. of a ceramic material such as aluminum oxide. After the surface mounting process, the circuit board 11 may be separated from the (ceramic) carrier 124, after which the circuit board 11 is mounted to the heat sink 12 provided with the galvanically separating layer 13. Alternatively, the ceramic support layer is permanently attached to the circuit board, and is configured to form part of the galvanically separating layer 13.

In FIG. 3b, the front end of the receiving portion 121 is provided with protruding "fingers" 125 that rest against the upper side of the circuit board 11.

Figure 3C:
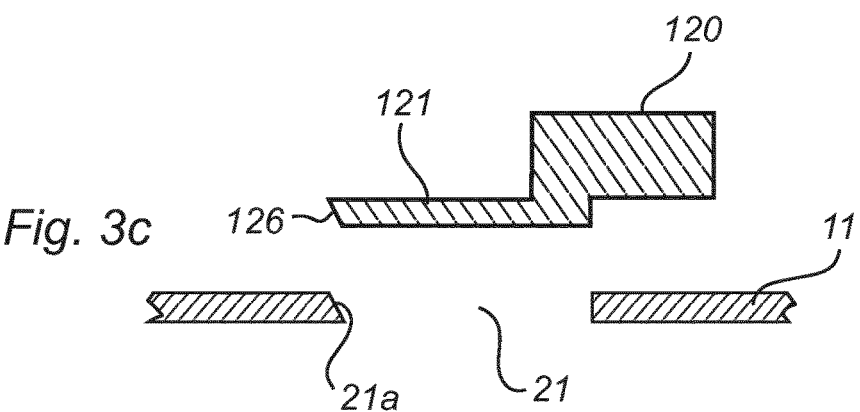

In FIG. 3c, finally, the front side 21a of the opening 21 is tapered, and the front side 126 of the receiving portion 121 of the heat buffer 120 has a corresponding tapering, such that the circuit board 11 will support the heat buffer.

When the approaches in FIGS. 3b and 3c are employed, and the heat buffer rests on the upper side of the circuit board 11 and not on a support underneath the circuit board, there may be minor variations in the vertical position of the underside of the heat buffer 120. In order to compensate for such variations, it may be preferred to use a so called "gap pad" of "gap filler" as the isolating layer 13, instead of aluminum oxide.

In the illustrated embodiments, with the exception of FIG. 3b, it is noted that the heat buffer 20, 120 has a shape with constant cross-section in a direction A. This makes it possible to manufacture the heat buffer by extrusion, thereby reducing cost significantly. If extrusion is not possible or preferred, the heat buffer 20, 120 may be formed e.g. by molding, punching a heated blank, or other suitable metal processing technique.

Further, in the illustrated examples the heat buffer 20, 120 is provided with a threaded hole 24 for receiving a screw 23. In situations where the thermal flag 18 serves as a terminal of the component 16, such a screw thus provides a convenient electrical connection point, e.g. for the drain/collector of a power transistor.

If the buffer 120 is supported by a carrier 124 during surface mounting, as illustrated in FIG. 3a, the threaded hole 24 may extend through the buffer 120 such that the screw 23 may be used to secure the buffer 120 against the carrier 124. The receiving portions 121 may then preferably have a thickness slightly larger than the thickness of the circuit board 11 (e.g. in the order of 0.1 mm thicker). By placing a resilient material (not shown) between the carrier 124 and circuit board 11, the circuit board 11 will remain fixed during the surface mounting process, while at the same time ensuring that the underside of all buffers 120 are located in the same plane. When the circuit board is then mounted to the heat sink 12 with isolating layer 13, again a resilient layer (again not shown) may be used to compensate level differences.

Figure 4:
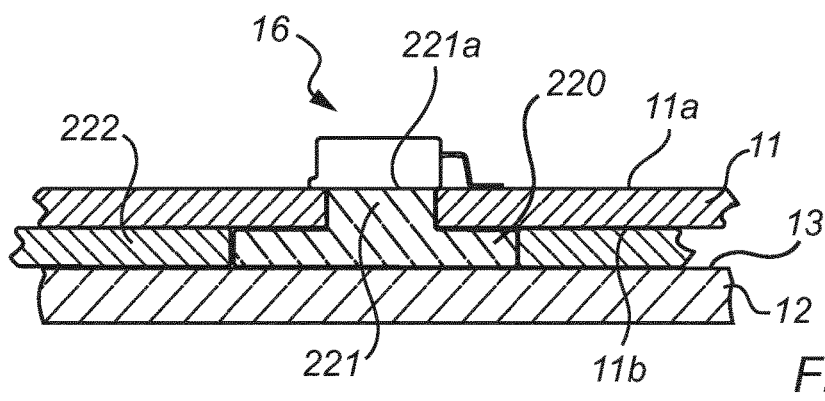
FIG. 4 shows an assembly according to a further embodiment of the present invention.

FIG. 4 very schematically shows an embodiment where the heat buffer 220 is mounted in the opening 21 from the opposite side of the circuit board 11 with respect to component 16.

In this case, a solder pad (not shown) is first printed on the opposite side 11b of the circuit board 11, and the heat buffer 220 is placed in the opening 21 and surface mounted to the circuit board. The PCB 11 is then turned over, solder pads are printed on the first surface 11a (including printing a solder pad on the flat upper surface 221a of the receiving portion 221 of the heat buffer 220). The component 16 is then placed on the surface 221a and surface mounted by heating.

The heat buffer 220 will in this case create a separation between the PCB 11 and the heat sink 12, which needs to be filled by a suitable filler 222.

The person skilled in the art realizes that the present invention by no means is limited to the preferred embodiments described above. On the contrary, many modifications and variations are possible within the scope of the appended claims. For example, the shape of the heat buffer may be different than the illustrated examples, and on the contrary be adapted to specific applications. Further, the details of the heat sink, its attachment to the circuit board, and the galvanic separation, are not critical to the present invention, and may be different.

The invention claimed is:

1. An assembly for dissipating heat generated by a heat generating electrical component which is surface mounted on a circuit board in a surface mounting process, comprising:
   a heat buffer made of a thermally and electrically conducing material, said heat buffer being surface mounted on the circuit board so as to be soldered to a thermal flag of the heat generating electrical component;
   a heat sink in thermal contact with the heat buffer; and
   a galvanic separation between the heat buffer and the heat sink.

2. The assembly according to claim 1, wherein:
   the heat buffer is mounted in a corresponding opening formed in the circuit board; and
   during the surface mounting process, the thermal flag is soldered on the upper surface of an essentially flat receiving portion of the heat buffer.

3. The assembly according to claim 2, wherein a protruding portion of the heat buffer is surface mounted to a solder pad, which is thermally connected to the heat sink by a plurality of vias extending through the circuit board.

4. The assembly according to claim 3, wherein the component and the heat buffer are both surface mounted to a solder pad which is thermally connected to the heat sink by a plurality of vias extending through the circuit board.

5. The assembly according to claim 4, wherein a receiving portion of the heat buffer has a thickness in the range of 90%-110% of a thickness of the circuit board.

6. The assembly according to claim 1, wherein:
   the heat buffer is surface mounted adjacent to the electrical component; and
   during the surface mounting process, the heat buffer is soldered to an end portion of the thermal flag which is accessible from above.

7. The assembly according to claim 6, wherein an upper surface of a receiving portion of the heat buffer is level with the surrounding circuit board.

8. The assembly according to claim 6, wherein a receiving portion of the heat buffer has a thickness in the range of 90%-110% of a thickness of the circuit board.

9. The assembly according claim 1, wherein:
   the electrical component and the heat buffer are surface mounted on the same side of the circuit board; and
   the heat sink is arranged on an opposite side of the circuit board.

10. The assembly according to claim 1, wherein:
    said thermal flag serves as a terminal of said electrical component; and
    said heat buffer is provided with a contact point for facilitating electrical connection of said terminal.

11. The assembly according to claim 10, wherein said contact point is a threaded hole for receiving a screw.

12. The assembly according to claim 1, wherein said heat buffer has a constant cross-section in one direction, thereby allowing manufacture by extrusion.

13. A method for mounting a heat buffer of a thermally and electrically conducting material on a circuit board in order to dissipate heat from a heat generating component, the method comprising surface mounting the component and the heat buffer on the circuit board by: printing solder pads on the circuit board; arranging the heat buffer and the component on the circuit board, such that the heat buffer is placed in electrical contact with a thermal flag of said component, and such that the heat buffer and selected terminals of the component are in electrical contact with at least one solder pad; and heating the circuit board with the component and the heat buffer arranged thereon, such that the component is soldered to the heat buffer, and the component and the heat buffer are both soldered to at least one solder pad.

14. The method according to claim 13, wherein the steps of arranging the heat buffer and the component on the circuit board includes:
    placing the heat buffer in a corresponding opening formed in the circuit board;
    arranging solder on an upper surface of an essentially flat receiving portion of the heat buffer; and
    placing the component on said solder,
    such that, during the heating step, the thermal flag of the component is soldered on the upper surface of the receiving portion.

15. The method according to claim 14, wherein a portion of the heat buffer is arranged on a solder pad which is thermally connected to an opposite side of the circuit board by a plurality of vias extending through the circuit board.

16. The method according to claim 13, further including placing the circuit board on a support, on which the underside of a receiving portion of the heat buffer may rest upon during the step of heating the circuit board.

17. The method according to claim 13, wherein the steps of arranging the heat buffer and the component on the circuit board includes:
- placing the component on a solder pad on the circuit board, such that an end portion of the thermal flag is accessible from above;
- arranging solder on the end portion of the thermal flag; and
- placing the heat buffer adjacent to the electrical component such that the heat buffer rests at least partly on the end portion of the thermal flag;
- such that, during the heating step, the heat buffer is soldered to the end portion of the thermal flag.

18. The method according to claim 17, wherein the heat buffer is arranged on a solder pad which is thermally connected to an opposite side of the circuit board by a plurality of vias extending through the circuit board.

\* \* \* \* \*